United States Patent [19]

Yoshihara et al.

[11] Patent Number: 4,515,876

[45] Date of Patent: May 7, 1985

[54] X-RAY LITHOGRAPHY MASK AND METHOD FOR FABRICATING THE SAME

[75] Inventors: Hideo Yoshihara, Yokohama; Akira Ozawa, Ebina; Misao Sekimoto, Yokohama; Toshiro Ono, Isehara, all of Japan

[73] Assignee: Nippon Telegraph & Telephone Public Corp., Tokyo, Japan

[21] Appl. No.: 513,954

[22] Filed: Jul. 15, 1983

[30] Foreign Application Priority Data

Jul. 17, 1982 [JP] Japan .............................. 57-124714
Jun. 24, 1983 [JP] Japan .............................. 58-112916

[51] Int. Cl.³ .............................................. G03F 9/00
[52] U.S. Cl. ........................................ 430/5; 430/323; 430/324; 430/966; 378/35; 204/192 C; 204/192 EC; 204/192 E
[58] Field of Search ................... 430/5, 966, 967, 313, 430/314, 323, 324; 204/192 C, 192 E, 192 EC; 378/35

[56] References Cited

U.S. PATENT DOCUMENTS

| | | | |
|---|---|---|---|
| 3,649,503 | 3/1972 | Terry | 204/192 E |
| 4,037,111 | 7/1977 | Coquin et al. | 378/35 |
| 4,260,670 | 4/1981 | Burns | 430/5 |
| 4,284,678 | 8/1981 | Jones | 428/195 |
| 4,451,544 | 5/1984 | Kawabuchi | 430/5 |
| 4,468,799 | 8/1984 | Harms et al. | 378/35 |

OTHER PUBLICATIONS

Bertelsen, IBM Technical Disclosure Bulletin, vol. 12, No. 10, Mar. 1970, p. 1600.
Thornton, J. Vac. Sci. Technol., vol. 14, No. 1, Jan./Feb. 1977, pp. 164–168.
Thornton, J. Vac. Sci. Technol., vol. 11, No. 4, Jul./Aug. 1974, pp. 666–670.
Matsuo, Appl. Phys. Lett. 36(9), May 1980, pp. 768–770.
John N. Randall, "High-Resolution Pattern Defination in Tungsten", Appl. Physis. Lett. 39(9), Nov. 1, 1981, pp. 742–743.
John N. Randall et al., "Preparation of X-Ray Lithography Masks Using a Tungsten Reactive Ion Etching Process", Appl. Phys. Lett. 41(3), Aug. 1, 1982, pp. 247–248.

Primary Examiner—John Kittle
Assistant Examiner—José G. Dees
Attorney, Agent, or Firm—Spencer & Frank

[57] ABSTRACT

An X-ray absorber layer in the form of single layer of high melting point metal such as Ta, W is formed with granular crystal grains on a mask substrate, so that an internal stress of the layer is reduced. A fine pattern is formed from the absorber layer by reactive sputter etching using $CBrF_3$ gas as an etchant, so that an X-ray absorber pattern is formed on the mask substrate. The X-ray lithography mask thus fabricated has a fine pattern such as submicron pattern with a high degree of pattern contrast and a high dimensional accuracy.

13 Claims, 53 Drawing Figures

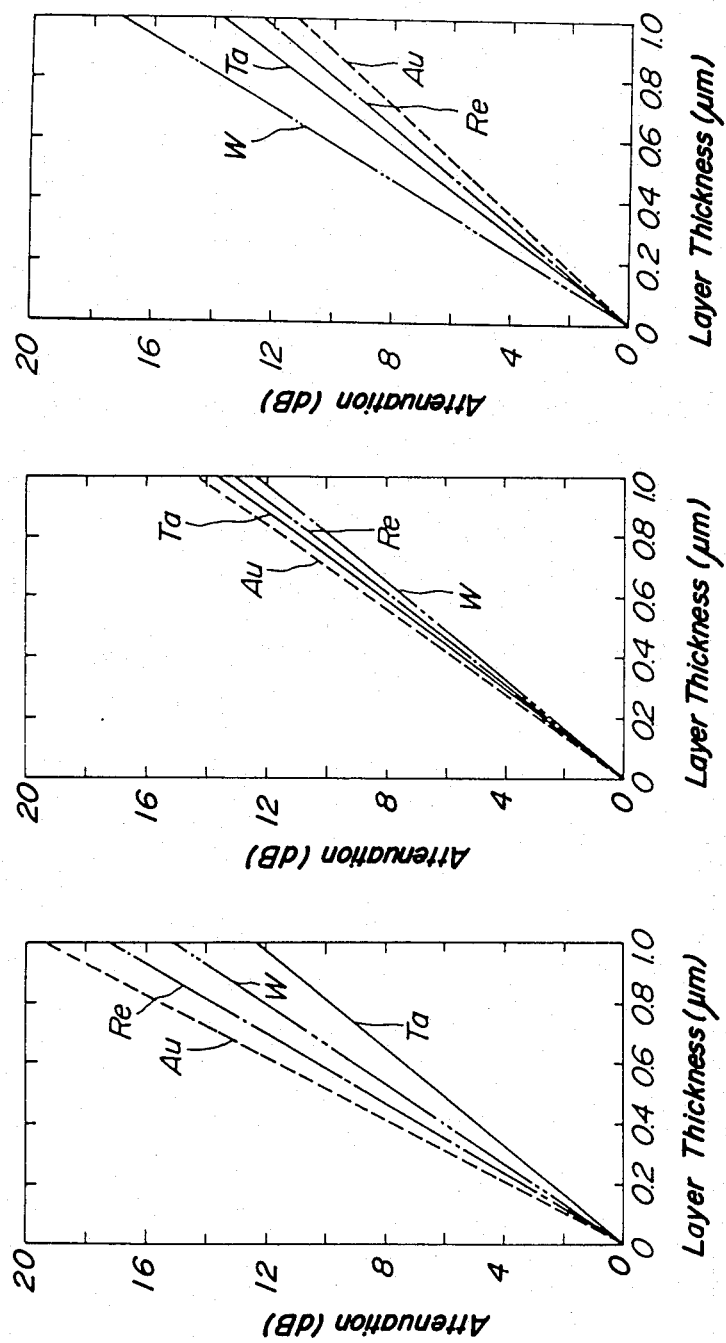

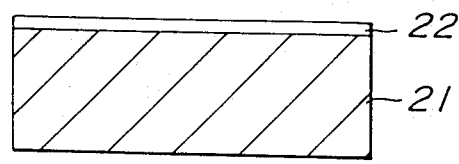
FIG._6A
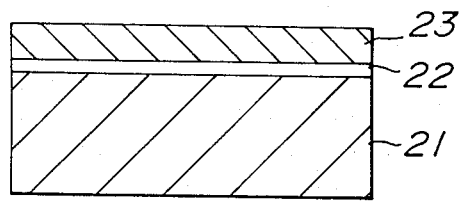
FIG._6B
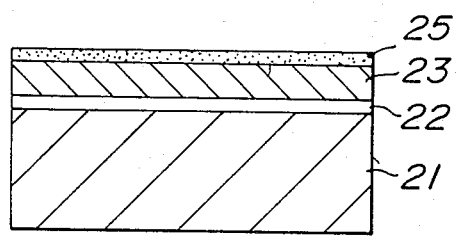
FIG._6C
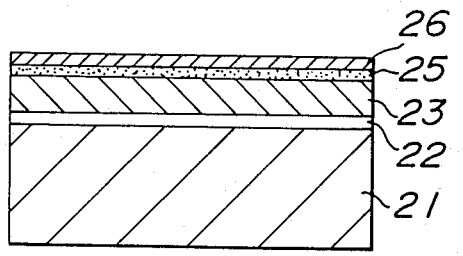
FIG._6D

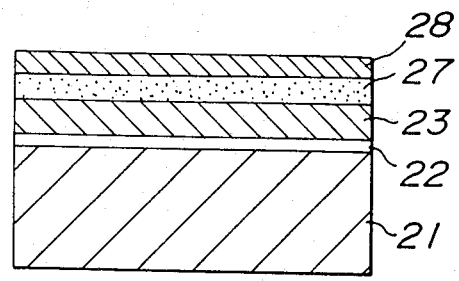
FIG_7D
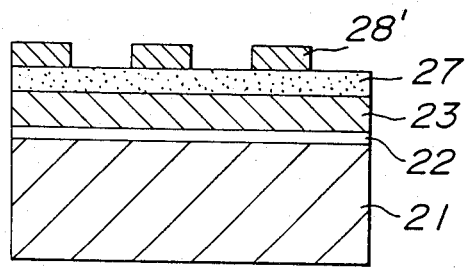
FIG_7E
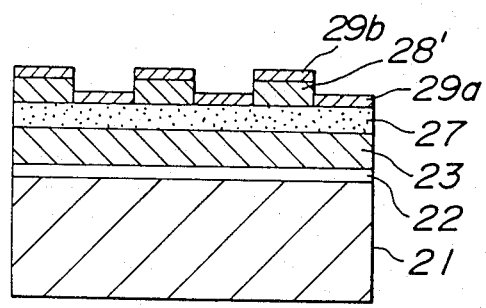
FIG_7F
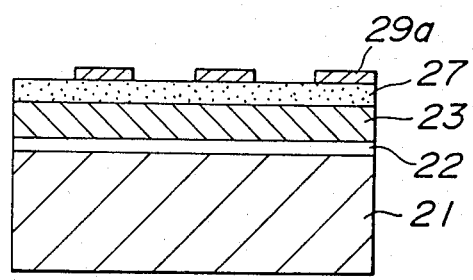
FIG_7G

X-RAY LITHOGRAPHY MASK AND METHOD FOR FABRICATING THE SAME

BACKGROUND OF THE INVENTION

1. Field of the invention

The present invention relates to an X-ray lithography technique which is used to replicate a fine pattern for the fabrication of semiconductor integrated circuit devices and more particularly to an X-ray lithography mask with a high degree of contrast and a submicron pattern and a process for manufacturing the same.

2. Description of the prior art

As is well known in the art, X-ray lithography is a technique in which soft X-rays having wavelengths from 4 to 50 Å are used as an exposing ray source so that fine patterns having submicron dimensions can be replicated. In general, an X-ray mask comprises an absorber pattern which absorbs soft X-rays and a mask substrate which supports the absorber pattern and which permits the transmission of soft X-rays.

As materials for absorber patterns, it is required to use materials which sufficiently absorb soft X-rays. If the wavelength of a soft X-ray is determined, the quantities of soft X-rays absorbed by an X-ray absorber can easily be calculated based on an X-ray absorption coefficient. FIGS. 1A, 1B and 1C illustrate the relationship of X-ray attenuation with thicknesses of various films in the cases of Mo-L radiation (5.41 Å), Si-K radiation (7.13 Å) and Al-K radiation (8.34 Å), respectively.

As is clear from FIGS. 1A–1C, it is readily understood that elements of higher atomic numbers such as gold Au, tantalum Ta, tungsten W, rhenium Re or the like must be used in order to obtain an X-ray attenuation of the order of 10dB, so that a sufficient degree of mask contrast is attained.

For instance, Laid-Open Japanese Patent Application No. 54-141571 (Japanese Patent Application No. 53-48717), entitled "Mask for Soft X-ray Lithography" discloses an X-ray mask of the type in which fine pattern apertures through which soft X-ray pass are formed in a strained thin film formed from a soft X-ray absorbing material such as gold Au, platinum Pt, palladium Pd, tungsten W, tantalum Ta, holmium Ho, erbium Er, uranium U or the like.

Laid-Open Japanese Patent Application No. 54-11677 (Japanese Patent Application No. 53-71437) corresponding to U.S. patent application Ser. No. 810,469, entitled "Mask for Use in Fine Line Lithography and Method for Fabricating the Same", discloses an X-ray mask comprising a mask substrate in the form of a thin membrane or film which is formed from a polymer such as parylen (trademark of Union Carbide Corporation) and which is transparent to a chemical radiation and chemical radiation absorber consisting of an oxide of a rare earth element, or an element having a high atomic number and a high density such as gold Au, platinum Pt, uranium U, indium In or the like. It also discloses an ion etching process, an electroplating process and a lift-off process for forming absorbing layers of a metal having a high density such as gold Au, platinum Pt, uranium U or the like. However, with these processes it is extremely difficult to produce a pattern by using a metal having a high density.

John N. Randall, et al. disclose in "High-resolution pattern definition in tungsten" (Applied Physics Letters 39(9), Nov. 1, 1981 pp. 742–743) a mask structure in which a glass substrate is coated with an aluminum film over which a tungsten film is deposited, so that the tungsten film is patterned to form a fine pattern by reactive sputter etching. However, they only disclose the experiments made on the tungsten films deposited on the glass substrates, but have not disclosed how internal stresses can be reduced when tungsten, i.e., a metal having a high melting point, is deposited on a glass substrate. Therefore, the mask has not been used in practice.

In practice, only gold Au is used as an absorber material. The reason follows. When Ta, W, Re or the like which has a high melting point is deposited in the form of a thin film, high stresses are produced so that the thin mask substrate is damaged and distorted.

Therefore, gold Au which is relatively easily processed has been used as an absorber material. When gold Au is used as an absorber material, the gold film must have a thickness of about 0.52 μm for Al-K radiation (8.34 Å) and about 0.68 μm for the Si-K radiation (7.13 Å) in order to obtain a mask contrast of 10dB. It follows, therefore, that the aspect ratio becomes higher than 1 so that the pattern width is 0.5 μm.

There are two conventional processes for providing gold absorbers. Namely, in one process an insulating film is processed to form an electroplating mask so that gold is plated on the mask substrate. The other process is the ion etching method.

The former process in which fine gold patterns are electroplated through a mask of insulating material can produce submicron patterns having steep profile or steeply vertical side walls. However, when a gold absorber has complicated patterns including mixtures of different sizes, a uniform current density distribution cannot be obtained. As a result, a portion having a pattern which is small in size becomes nonuniformly thin in its thickness dimension. Furthermore, it is difficult to control the quality of the plating solution, which causes fluctuations in the quality of the gold absorber patterns. Moreover, many fabrication steps are required in this process. The latter process in which a gold absorber pattern is formed by ion etching will be explained with reference to FIGS. 2A–2H. In FIG. 2A, a mask substrate 2 made of a material such as SiN or $Si_3N_4$ capable of transmitting X-rays is arranged on a silicon wafer 1 and then a thin tantalum or titanium primary coat layer 3 is deposited on the mask substrate 2 so that the adhesion between the mask substrate 2 and a gold X-ray absorber layer is ensured. Thereafter, as shown in FIG. 2B, gold which acts as an absorber is deposited on the undercoating layer 3 to form an X-ray absorber layer 4.

As shown in FIG. 2C, a metal layer 5 of titanium or tantalum is deposited on the surface of the X-ray absorber layer 4 on which a resist layer 6 is formed, as shown in FIG. 2D. Thereafter, a desired pattern is transferred to the resist layer 6 by exposure and then the patterned resist layer 6 is developed so that a desired resist pattern 6' is formed, as shown in FIG. 2E.

Next, an etching process using the plasma of $CF_4$ is applied to the metal layer 5 through the resist pattern 6' as a mask, so that an etching mask 5' as shown in FIG. 2F is formed from the metal layer 5. Thereafter, the resist pattern 6' is removed and then an ion etching process using the ions of an inert gas such as argon is applied to the X-ray absorber layer 4 through the etching mask 5' so as to obtain an X-ray absorber pattern 4' having the desired pattern from the X-ray absorber layer 4, as shown in FIG. 2G. Subsequently, the undercoating layer 3 is ion-etched.

Thereafter, the wafer 1 is etched through a mask, so that a silicon frame 1' is formed in the periphery of the Si wafer 1, as shown in FIG. 2H. In this way, an X-ray mask is fabricated.

According to the above-described ion etching process, the etched gold particles are redeposited on the side walls of the pattern 4' and the metal etching mask 5' made of titanium or tantalum is greatly retarded due to the ion etching. Consequently, the angle of inclination of the side walls of the X-ray absorber pattern 4' is of the order of 75° as shown in FIG. 2G.

Thus, with the prior art ion etching process it has been difficult to form a fine gold X-ray absorber pattern of submicron order which has a sufficient contrast.

In order to overcome the above and other problems encountered in the ion etching process, there has been proposed a reactive sputter etching process (See Applied Physics Letters, 39(9), pp. 742-743 and 41(1), pp. 247-248) by which tungsten absorber patterns are formed using a mixture gas of $SF_6$ and $O_2$.

Stresses in the tungsten layer cannot be sufficiently relieved, so that the tungsten layer is deposited on an aluminum undercoating layer deposited on a glass substrate. Even when a polyimide membrane is used as a practical mask substrate, an aluminum undercoating layer of the thickness of 100 Å is deposited on the substrate and then a tungsten layer of 800 Å in thickness is deposited on the aluminum layer. In this case, the internal stress can not be sufficiently relieved and sufficient contrast cannot be obtained, so that the mask cannot be used satisfactorily in practice.

Furthermore, in order to practically form an X-ray lithography mask by the tungsten layer, the aluminum undercoating layer must be removed for the purpose of alignment, but it is very difficult to remove the aluminum undercoating layer without causing any damage to the tungsten X-ray absorber pattern. As a result, the X-ray mask cannot be satisfactorily used in practice.

Tantalum Ta is very advantageous as an absorber material for an X-ray mask.

However, tantalum Ta has a high melting point, so that it is difficult to relieve internal stresses in a tantalum layer. A tantalum layer having a high internal stress tends to be separated from the mask substrate or to cause greater distortions in the mask substrate. In the worst case, the internal stress in the tantalum layer damages the mask substrate. With such a tantalum layer having a high internal stress, it has been impossible to provide an X-ray lithography mask formed by a single tantalum layer. If such a single tantalum layer could be advantageously produced the fabrication of an X-ray lithography mask would be much facilitated.

SUMMARY OF THE INVENTION

With the above in view, it is an object of the present invention to provide an X-ray lithography mask which overcomes the above disadvantages and other problems encountered in the conventional X-ray lithography mask.

It is another object of the present invention to provide an X-ray lithography mask in which a metal such as tantalum or tungsten having a high melting point and an X-ray absorption coefficient which is substantially the same as that of gold within a wavelength region of a soft X-ray suitable for X-ray lithography is used as an X-ray absorber material.

It is a further object of the present invention to provide an X-ray lithography mask which has patterns having a high degree of contrast with accurate dimensions.

It is still a further object of the present invention to provide an X-ray lithography mask which is constructed inexpensively.

It is yet a further object of the present invention to provide a method for fabricating an X-ray lithography mask which is adapted for mass production and which can fabricate fine patterns with a high accuracy.

The present invention is based on the recognition that a metal such as tantalum or tungsten having a high melting point has a high X-ray absorption coefficient and can be processed with reactive sputter etching. Furthermore, the present invention has been achieved, based upon extensive studies and experiments with respect to the reduction of internal stress in an X-ray absorber layer and fine pattern etching.

In order to achieve the above-described objects, an X-ray lithography mask according to the present invention comprises a mask substrate and an X-ray absorber layer in the form of a single layer of a high melting point metal. At least a portion of this single layer at the side facing the mask substrate consists of granular crystal grains, and the X-ray absorber layer has a desired pattern.

In a preferred embodiment of the present invention, all of the single layer consists of granular crystal grains of the high melting point metal. Here, it is preferable that (211) and (110) planes of the high melting point metal coexist in the single layer and are in parallel with the surface of the mask substrate.

An electron absorber layer may preferably be formed on the X-ray absorber layer.

It is preferable that the high melting point metal is tantalum or tungsten. The electron absorber layer may preferably consist of silicon oxide, silicon nitride or a polymer. The mask substrate may preferably consist of a substance selected from the group consisting of SiN, $Si_3N_4$, SiC, BN, polyimide, Mylar and a combination thereof.

In order to achieve the above-described objects, a method for fabricating an X-ray lithography mask according to the present invention comprises a first step of placing a specimen having an X-ray mask substrate on a specimen table in a sputtering apparatus having means for controlling a flow rate of a rare gas contained in the sputtering apparatus and means for controlling the pressure of the rare gas in such a way that the specimen is electrically insulated from ground potential; a second step of forming a layer of a high melting point metal on the X-ray mask substrate under the conditions that the flow rate and the gas pressure of the rare gas are maintained at predetermined values; and a third step of forming an X-ray absorber layer with a predetermined pattern from the high melting point metal by reactive sputter etching.

Preferably, the above-mentioned third step includes a first sub-step of forming a resist pattern on the high melting point layer of tantalum or tungsten; and a second sub-step of forming the X-ray absorber layer with the desired pattern by reactive sputter etching using $CBrF_3$ gas as an etchant, with the resist pattern being used as a mask.

It is also preferable that the above-mentioned third step includes a first sub-step of forming a silicon oxide or silicon nitride layer on the surface of the high melting point layer of tantalum or tungsten; a second sub-step of forming a resist pattern on the surface of the silicon oxide or silicon nitride layer; a third sub-step of forming a silicon oxide or silicon nitride pattern layer from the silicon oxide or silicon nitride layer by reactive sputter etching, with the resist pattern being used as a mask; and a fourth sub-step of forming the X-ray absorber layer with the desired pattern by reactive sputter etching using $CBrF_3$ gas as an etchant, with the silicon oxide or silicon nitride pattern layer being used as a mask.

It is also preferable that the above-mentioned third step includes a first sub-step of applying a layer of a polymer having a high degree of resistance against dry etching on the surface of the high melting point layer of tantalum or tungsten; a second sub-step of forming a resist pattern on the surface of the layer of the polymer; a third sub-step of depositing a titanium or chrominum layer on the resist pattern; a fourth sub-step of forming a titanium or chrominum pattern by a lift-off process; a fifth sub-step of forming a polymer pattern by reactive sputter etching in the atmosphere of oxygen, with the titanium or chrominum pattern being used as a mask; and a sixth sub-step of forming the X-ray absorber layer with the desired pattern by the reactive sputter etching using $CBrF_3$ gas as an etchant, with the polymer pattern being used as a mask.

Here, the rare gas may be selected from the group consisting of xenon, argon and krypton.

It is preferable that the flow rate of the rare gas and the gas pressure in the sputtering apparatus are controlled in such a way that the high melting point metal layer formed by the second step includes granular crystal grains. Here, at least the surface of the high melting point metal layer on the side of the X-ray mask substrate may be formed as granular crystal grains.

Preferably, in the above-mentioned first step, the specimen may be electrically floated with respect to ground potential. Here, the gas pressure in the sputtering apparatus and the RF power supplied to the sputtering apparatus in the second step can preferably be controlled in such a way that the surface of the specimen is maintained at a floating potential within a range from $-10$ to $-20$ V.

Alternatively, a DC bias potential within a range from $-10$ to $-20$ V is applied to the specimen in the above-mentioned first step.

BRIEF DESCRIPTION OF THE DRAWINGS

FIGS. 1A, 1B and 1C are graphs each illustrating the relationship between the thickness of an absorber layer and X-ray attenuation when Mo-L, Si-K and Al-K radiations are used;

FIGS. 6A-6H are schematic cross sectional views used to explain the sequential steps in another embodiment of a method for fabricating an X-ray lithography mask according to the present invention, intermediate steps of which includes a step for forming a silicon oxide layer or a silicon nitride layer;

FIGS. 7A-7J are schematic cross sectional views used to explain the sequential steps in a further embodiment of a method for fabricating an X-ray lithography mask according to the present invention, in which a positive pattern is reversed to a negative pattern by using a lift-off process employing Ti;

DETAILED DESCRIPTION OF THE PREFERRED EMBODIMENTS

Referring to the accompanying drawings, the present invention will be described in detail.

Figure 3:
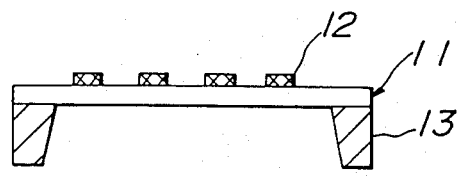
FIGS. 3 and 4 are schematic cross sectional views showing two embodiments of an X-ray lithography mask according to the present invention.
Figure 4:
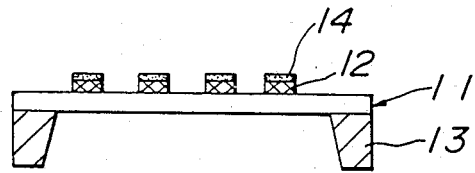

FIGS. 3 and 4 show in cross section two embodiments of an X-ray lithography mask according to the present invention. In FIG. 3, reference numeral 11 designates a mask substrate capable of substantially transmitting X-rays therethrough; 12, an X-ray absorber pattern made of a metal such as Ta or W having a high melting point; and 13, a silicon frame for supporting the X-ray absorber pattern 12.

The X-ray lithography mask as shown in FIG. 4 is substantially similar in construction to that shown in FIG. 3, except that an electron absorber layer 14 consisting of a silicon oxide ($SiO_2$) layer, a silicon nitride (SiN, $Si_3N_4$) layer or a polymer layer such as a polyimide layer is deposited on the surface of the X-ray absorber layer 12.

The material of the mask substrate 11 may be SiN, $Si_3N_4$, BN, SiC, polyimide, Mylar (trademark of Du Pont) or a combination thereof. It is preferable to use SiN, $Si_3N_4$, BN or SiC in order to obtain a high precision pattern.

While in the present invention, an undercoating layer of Ti is not provided on the mask substrate 11, this does not mean that the mask substrate 11 consists only of a single X-ray transmission layer. It is to be understood that the mask substrate 11 in the present invention includes a multi-layer structure in the form of a combination of at least two of the above-described materials, (i.e. SiN, $Si_3N_4$, SiC, BN, polyimide and Mylar, while the X-ray absorber layer 12 is a single layer.

Referring next to FIGS. 5A–5F, a first embodiment of an X-ray lithography mask according to the present invention and a process for fabricating the same will be explained.

Figure 5A:
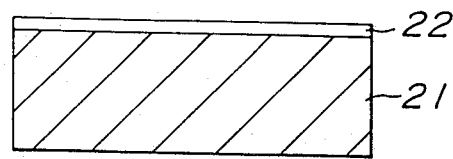
FIGS. 5A-5F are schematic cross sectional views used to explain the sequential steps in one embodiment of a method for fabricating an X-ray lithography mask according to the present invention.

First, as shown in FIG. 5A, formed on the surface of a silicon wafer 21 is a mask substrate 22 having a thickness of about 2 $\mu$m and which is made of SiN. The mask substrate 22 is capable of permitting the transmission of X-rays.

Figure 5B:
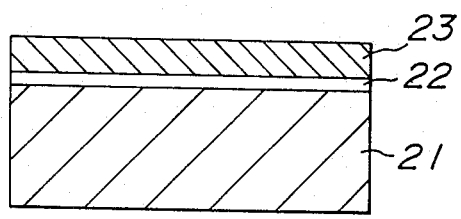

Next, as shown in FIG. 5B, an X-ray absorber layer 23 which is made of a high melting point metal such as Ta and which has a low internal stress is deposited on the mask substrate 22 to the thickness of a order of 8,000 Å by means of an RF sputtering process.

As will be described in detail hereinafter, it is preferable that the internal stress in this Ta layer 23 is reduced to less than $\pm 1 \times 10^9$ dyne/cm$^2$. For this purpose of reducing the internal stress, it is preferable to use an RF sputtering apparatus provided with a gas flow rate control means and a conductance valve for controlling the gas pressure when depositing the Ta layer 23, as will be described in more detail hereinafter.

Figure 5C:
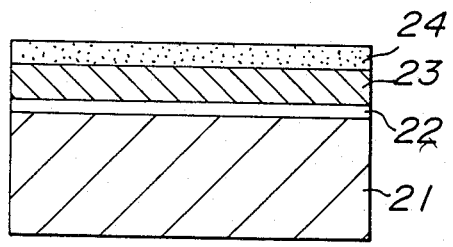

Thereafter, as shown in FIG. 5C, applied to the surface of the X-ray absorber layer 23 is a resist layer 24 having a thickness of the order of 0.5 $\mu$m and made of a polymeric material such as PMMA resist by a spin coating process.

Figure 5D:
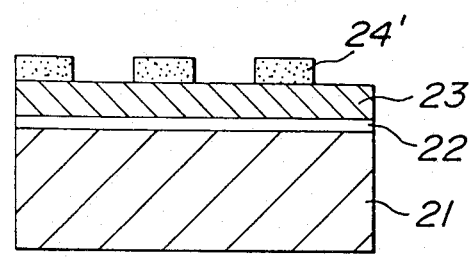

Then, the desired pattern is exposed on the resist layer 24 by using, for instance, ultraviolet rays, electron beams or ion beams and the exposed resist layer 24 is developed to form a resist pattern 24' having a desired fine pattern, as shown in FIG. 5D. The resist pattern 24' serves as an electron absorber.

Figure 5E:
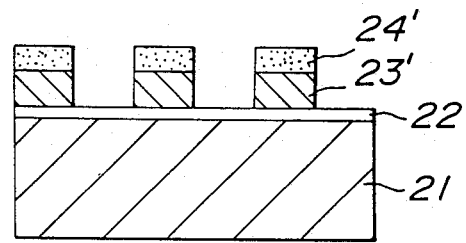

Next, as shown in FIG. 5E, an X-ray absorber pattern 23' of Ta is formed from the X-ray absorber layer 23 by the reactive sputter etching process using $CBrF_3$ gas as an etchant, with the resist pattern 24' being used as a mask.

Figure 5F:
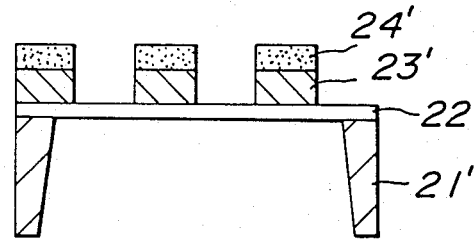

Finally, as shown in FIG. 5F, the silicon wafer 21 is subjected to etching so that a silicon frame 21' is formed in the periphery of the wafer 21. Thus, an X-ray lithography mask with a desired fine pattern is fabricated.

As described above, in the reactive sputter etching process using a $CBrF_3$ gas, the resist pattern was used as an etching mask, but it is to be noted that, as will be described in detail with reference to FIGS. 6A–6H, the resist pattern is first used so that a silicon oxide layer or a silicon nitride layer is etched by the reactive sputter etching process using $C_2F_6$ or $CF_4+H_2$ as an etchant and subsequently the Ta X-ray absorber layer may be formed with a fine pattern of the silicon oxide or silicon nitride layer being used as a mask, in the same manner as that in the above embodiment.

More particularly, as shown in FIG. 6A, the mask substrate 22 is formed on the surface of the silicon wafer 21 and the X-ray absorber layer 23 of Ta is formed on the mask substrate 22, as shown in FIG. 6B, in a manner substantially similar to that described above with reference to FIG. 5B.

Next, as shown in FIG. 6C, an etching mask layer 25 having a thickness of the order of, for example, 2,000 Å and made of $SiO_2$ is formed by a suitable conventional process on the surface of the X-ray absorber layer 23. The $SiO_2$ etching mask layer 25 serves as an electron absorber layer.

Figure 6E:
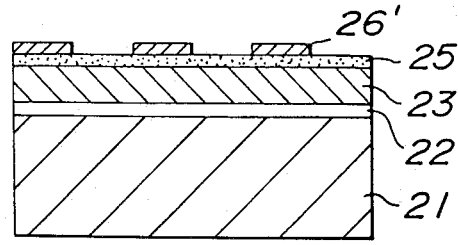

Thereafter, as shown in FIG. 6D, a resist layer 26 is formed on the surface of the etching mask layer 25 and then a desired pattern is exposed on the surface of the resist layer 26 and the exposed resist layer 26 is developed, so that a resist pattern 26' having a desired pattern is formed as shown in FIG. 6E.

Figure 6F:
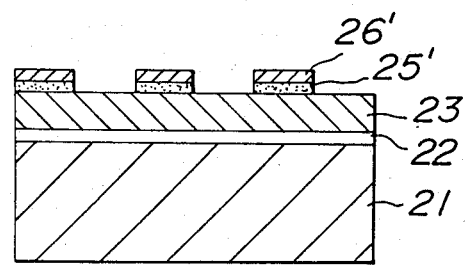

Next, a reactive sputter etching process is carried out by using $C_2F_6$ or $CF_4+H_2$ gas, with the resist pattern 26' being used as a mask, so that an etching mask pattern 25' having a fine $SiO_2$ pattern is formed, as shown in FIG. 6F. The etching mask pattern 25' serves as an electron absorber layer.

Figure 6G:
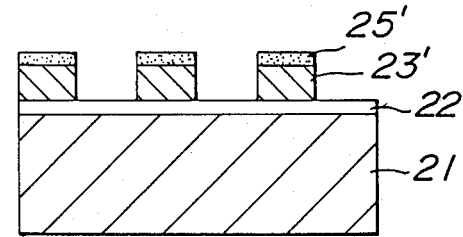

Thereafter, as shown in FIG. 6G, the resist pattern 26' is removed from the etching mask pattern 25', if necessary, and the reactive sputter etching process is carried out by using $CB_rF_3$ gas so that an X-ray absorber pattern 23' having a desired fine Ta pattern is formed.

Figure 6H:
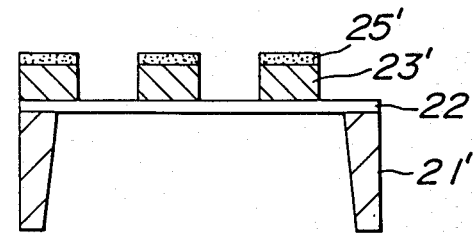

Finally, as shown in FIG. 6H, the silicon wafer 21 is etched so that the frame 21' remains in the periphery of the wafer 21. Thus, an X-ray lithography mask with a desired fine pattern is fabricated.

Figure 7A:
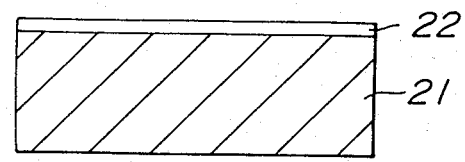
Figure 7B:
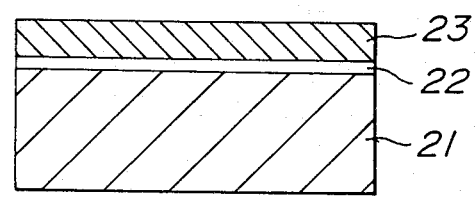

A positive pattern can be converted into a negative pattern as will be described with reference to FIGS. 7A–7J. First, the mask substrate 22 is formed on the surface of the silicon wafer 21, as shown in FIG. 7A in a manner substantially similar to that described above with reference to FIG. 5A. Then, as shown in FIG. 7B, the Ta X-ray absorber layer 23 is formed on the mask substrate 22 in a manner substantially similar to that described above with reference to FIG. 5B.

Figure 7C:
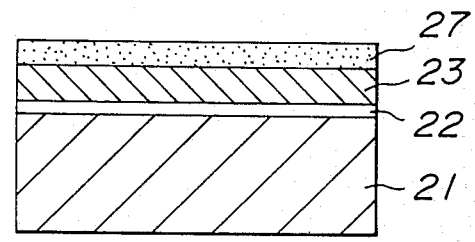
Figure 7H:
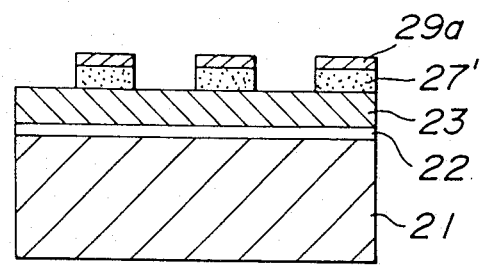

Next, as shown in FIG. 7C, an etching mask layer 27 having a thickness of about 0.8–1.0 $\mu$m is formed on the surface of the X-ray absorber layer 23 by a suitable conventional process. The etching mask layer 27 may be made of a polymeric material such as polyimide which has sufficient resistance to the reactive sputter etching process to be described hereinafter. The etching mask layer 27 will be patterned later and the patterned etching mask layer serves as an electron absorber pattern.

Next, as shown in FIG. 7D, a resist layer 28 is formed on the surface of the etching mask layer 27. Then, a desired fine pattern is exposed on the resist layer 28 and the exposed resist layer 28 is developed, so that a resist pattern 28' having a desired pattern is formed from the resist layer 28, as shown in FIG. 7E.

Thereafter, as shown in FIG. 7F, a metal such as titanium Ti or chrominum Cr is vapor deposited on the resist pattern 28' and the exposed areas of the etching mask layer 27, so that a metal layer 29a and a metal layer 29b having the thickness of the order of 500 Å are formed on the area where the resist pattern 28' is not formed and on the resist pattern 28', respectively.

Subsequently, the resist pattern 28' and the metal layer 29b thereon are removed by dissolving or lifting off the resist pattern 28' from the etching mask layer 27. As a result, a fine Ti or Cr pattern 29a is formed, as shown in FIG. 7G.

Thereafter, the reactive sputter etching process is carried out in an atmosphere of $O_2$ by using the metal pattern 29a as a mask, so that an etching mask pattern 27' made of polymeric material, having a desired pattern and having a thickness of the order from 0.8 to 1.0 μm, is formed as shown in FIG. 7G.

Figure 7I:
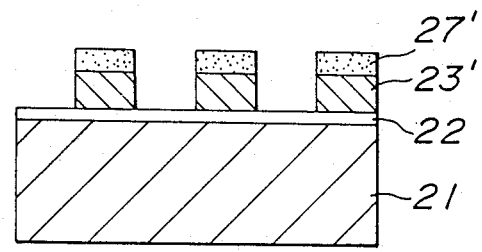

Next, as shown in FIG. 7I, the X-ray absorber layer 23 is etched by the reactive sputter etching process using $CB_rF_3$ gas as an etchant, with the metal plate 29a and the etching mask pattern 27' being used as a mask. As a result, the Ta X-ray absorber pattern 23' having the desired fine pattern is formed. If the pattern 23' as shown in FIG. 5F is positive, then the pattern 23' is negative and vice versa. Alternatively, the reactive sputter etching process may be carried out, after the removal of the metal pattern 29.

Figure 7J:
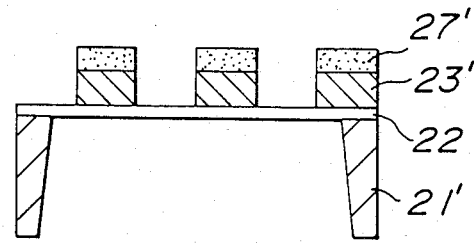

Finally, as shown in FIG. 7J, the silicon wafer 21 is etched, so that a frame 21' is formed in the periphery of the wafer 21. Thus, the X-ray lithography mask with the desired fine pattern is fabricated.

In order to form an X-ray absorber layer 23 made of a high melting point material such as Ta or W in the form of a single layer in the present invention, it is essentially required to reduce or relieve the internal stress in the absorber layer of Ta or W. This will be described with reference to the formation of the Ta layer 23 having a low internal stress on the X-ray mask substrate 22 made of, for example, SiN.

Figure 8A:
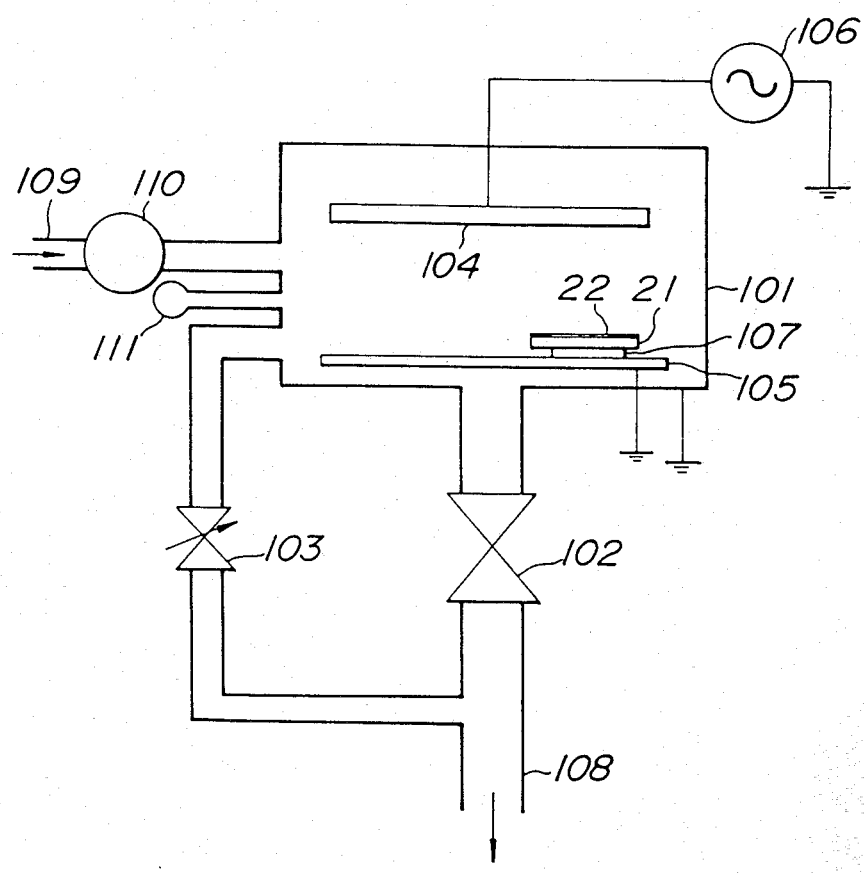
FIG. 8A is a schematic view showing an embodiment of a sputtering apparatus embodying the present invention to form a Ta absorber layer.

FIG. 8A shows an embodiment of a sputtering apparatus for depositing a Ta layer in the present invention. Reference numeral 101 designates a vacuum chamber; 102 a main valve for controlling the evacuation of the vacuum chamber 101; and 103 a conductance variable valve for controlling the pressure of a rare gas in the vacuum chamber 101. Within the vacuum chamber 101 are disposed a Ta target 104 and a specimen table 105. RF power is supplied to the Ta target 104 from an RF power supply 106. The silicon wafer 21 as a specimen having the mask substrate 22 is disposed via an insulating plate 107 on the silicon wafer 21. It is to be noted that both the vacuum chamber 101 and the specimen table 105 are grounded.

It is preferable that the mask substrate 22 per se is electrically floated with respect to the ground potential or that a predetermined bias voltage, for instance a DC bias voltage in a range from $-10$ to $-20$ V is applied to the mask substrate 22.

Still referring to FIG. 8A, reference numeral 108 designates an evacuation system communicating the valves 102 and 103 so that exhaust gases from the vacuum chamber 101 through the respective valves 102 and 103 are merged to be evacuated. Reference numeral 109 designates an inlet for introducing a rare gas such as Xe, Ar or Kr into the vacuum chamber 101 through a gas-flow-rate control system 110, and 111 a vacuum gage for measuring the degree of vacuum in the vacuum chamber 101.

In order to form the Ta layer, the specimen, i.e., the wafer 21 with mask substrate 22 thereon is mounted on the specimen table 105 via the insulating plate 107 in the vacuum chamber 101. Subsequently, the vacuum chamber 101 is evacuated through the main valve 102 by the evacuation system 108, so that the degree of vacuum in the vacuum chamber 101 is substantially higher than $5 \times 10^{-6}$ Torr.

Next, a rare gas is introduced through the inlet 109 into the vacuum chamber 101. The amount of the introduced rare gas is controlled by the gas-flow-rate control system 110 at a predetermined flow rate (for instance, 7–10 cc/min). The pressure within the vacuum chamber 101 is monitored by the vacuum gage 111, so that the pressure in the vacuum chamber 101 is confirmed to be at a predetermined level. Under this condition, the main valve 102 is closed and the variable valve 103 is controlled in such a way that the pressure in the vacuum chamber 101 is determined at a set pressure within a tolerance of 1/1000 Torr.

Under these conditions, the RF power supply 106 is energized so that the Ta target 104 is sputtered. The RF power supplied from the RF power supply 106 is so controlled that the potential on the surface of the mask substrate 22 is maintained between $-10$ and $-20$ V.

Figure 9:
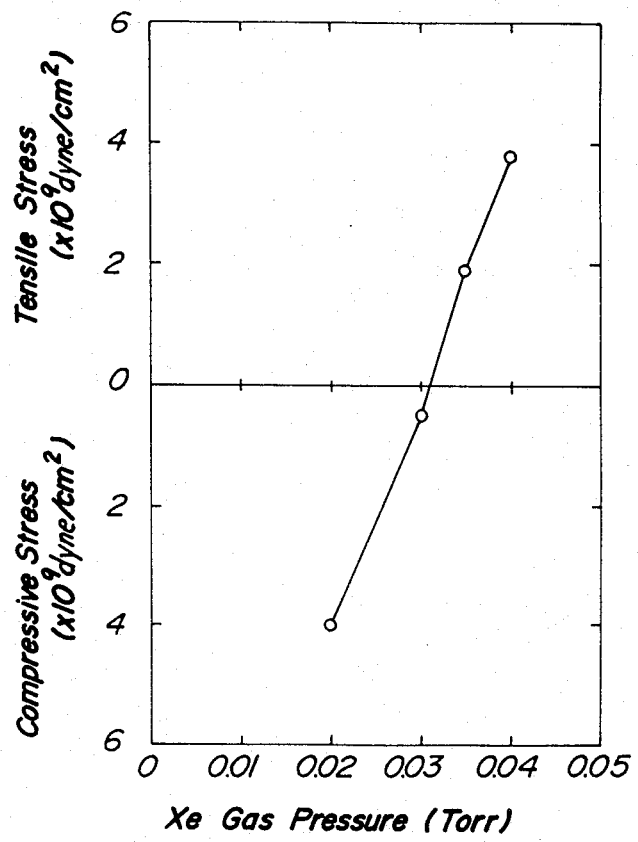
FIGS. 9 and 10 are graphs each showing the relationship between the pressure of a rare gas and the internal stress of a Ta layer when the layer is formed by the sputtering process.

FIG. 9 illustrates the relationship between the pressure of Xe gas, the flow rate of which is maintained constantly at 7 cc/min, and the internal stress, in the case that the pressure in the vacuum chamber 101 is set at a value of the order of $10^{-2}$ Torr within a tolerance of 1/1000 Torr and an RF power of 700 W is supplied to the Ta target 104 so that a Ta layer 23 having a thickness from 0.5 to 0.65 μm is deposited on the surface of the SiN mask substrate 22.

As is clear from FIG. 9, the internal stress within the Ta layer 23 varies over a wide range in response to variation of the pressure of the Xe gas. When the pressure of the Xe gas is 0.02 Torr, the internal stress in the Ta layer 23 is a compressive stress and is of the order of $4 \times 10^9$ dyne/cm$^2$. On the other hand, when the pressure of the Xe gas is 0.04 Torr, the internal stress in the Ta layer 23 is a tensile stress and is of the order of $3.8 \times 10^9$ dyne/cm$^2$.

In this manner, even a slight change of the pressure of the Xe gas causes the internal stress in the Ta layer 23 to change abruptly between a compressive stress and a tensile stress. Therefore, according to the present invention, the pressure of the Xe gas is precisely controlled by means of the flow-rate control system 110, so that a Ta layer having a low internal stress within $\pm 1 \times 10^9$ dyne/cm$^2$ can be obtained.

Figure 10:
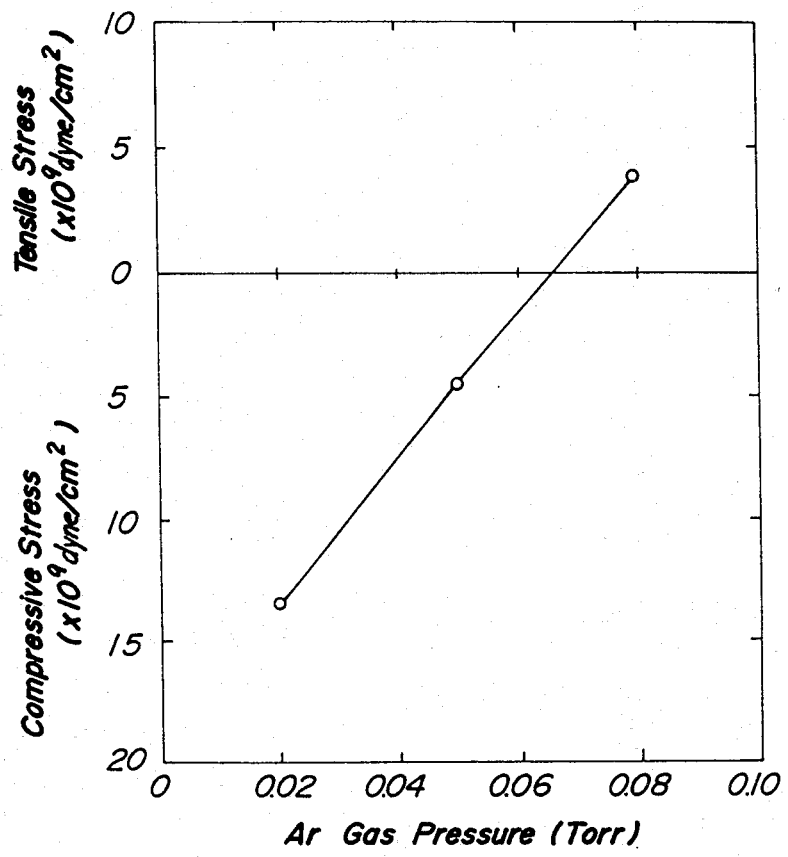

The dependence of the internal stress upon the pressure of the rare gas varies, depending upon the kind of rare gas used. For instance, when argon Ar is used, the relationship depicted in FIG. 10 is obtained. Furthermore, the dependence of internal stress upon the pressure of the rare gas may also be controlled by suitably selecting the design factors of the sputtering apparatus. In addition, the dependence of the internal stress upon the pressure of the rare gas also varies by changing the kind of target material from Ta to W.

It should be noted that if the surface potential of the mask substrate 22 is less than $-20$ V, the internal stress becomes a compressive stress regardless of the pressure of the rare gas. The magnitude of this compressive stress is high. On the other hand, if the surface potential of the mask substrate 22 is higher than $-10$ V, the internal stress becomes a tensile stress regardless of the pressure of the rare gas. The magnitude of this tensile stress is high.

With the above in view, in one example, a Xenon gas was introduced into the sputtering apparatus of the type shown in FIG. 8A. If the pressure within the vacuum chamber 101 was controlled substantially at $10^{-2}$ Torr within a tolerance of 1/1000 Torr and the surface potential of the substrate was controlled at a level within a range between $-10$ and $-20$ V, the Ta layer 23 having a low internal stress was deposited on the mask substrate 22.

Figure 8B:
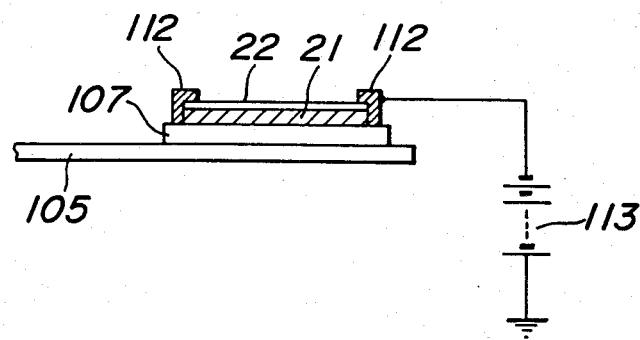
FIG. 8B is an enlarged fragmentary view showing a modified sputtering apparatus embodying the present invention.

A modification of the sputtering apparatus shown in FIG. 8A is shown in FIG. 8B. Referring to FIG. 8B, the silicon wafer 21 as a specimen and a mask substrate 22 are securely held or clamped in position on the specimen table 105 by a substrate holder 112. The substrate holder 112 is connected to a DC bias voltage supply 113, so that a DC bias voltage from −10 to −20 V is applied to the substrate holder 112. By using this sputtering apparatus, a Ta layer with a low internal stress was obtained.

As described above, according to the present invention, the internal stress in the Ta layer can be controlled at any desired value. That is, a single Ta layer with a low internal stress for an X-ray absorber layer can be provided.

When the surface potential of the mask substrate is maintained at a level within a region from −10 to −20 V, ions having energies from −10 to −20 V are bombarded against the surface of the Ta layer, so that the energy imparted to the Ta atoms by the ion bombardment is in this range. As a result, the Ta atoms can move freely over the surface of the deposited tantalum layer. That is, surface migration is promoted so that the growth of granular crystal grains is facilitated. Consequently, a Ta layer having a low internal stress is formed.

FIGS. 11A and 11B, FIGS. 12A and 12B, and FIGS. 13A and 13B are scanning electron micrographs, showing the surfaces and cross sections of the Ta layers when the internal stresses are substantially zero, compressive and tensile, respectively. In order to show the morphologies clearly, the surfaces and cross sections were etched with an etching solution for structure observation ($HCl:HNO_3:H_2SO_4 = 1:1:2.5$).

Figure 11A:
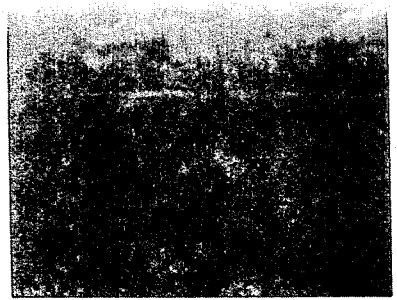
FIGS. 11A and 11B are scanning electron micrographs showing the morphologies in cross section and on the surface of a Ta layer when the internal stress of the layer is substantially zero, respectively.
Figure 11B:
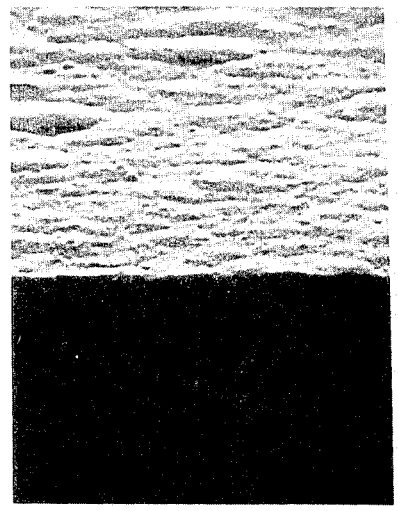
Figure 12A:
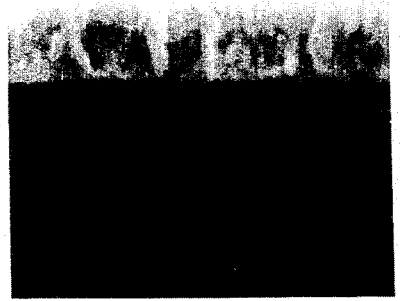
FIGS. 12A and 12B are scanning electron micrographs showing the morphologies in cross section and on the surface of a Ta layer when the internal stress is a compression stress of $4 \times 10^9$ dyne/cm$_2$, respectively.
Figure 12B:
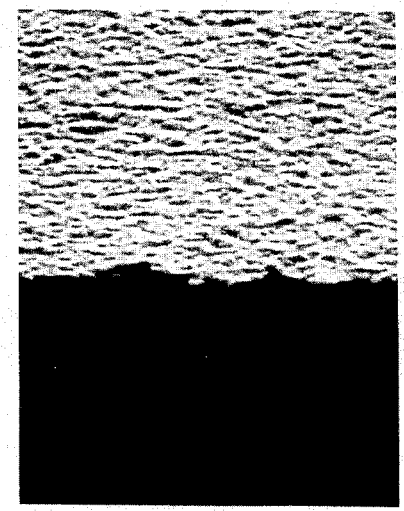
Figure 13A:
FIGS. 13A and 13B are scanning electron micrographs showing the morphologies in cross section and on the surface when the internal stress is a tensile stress of $3 \times 10^9$ dyne/cm$^2$, respectively.
Figure 13B:
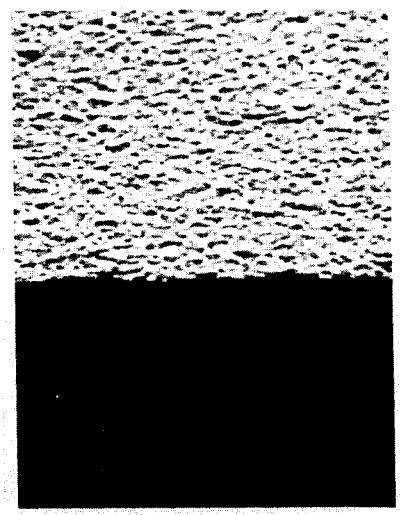

FIGS. 11A and 11B shown the micrographs of a Ta layer whose internal stress is substantially zero. FIGS. 12A and 12B show the micrographs when the internal stress is compressive and is of the order of $4 \times 10^9$ dyne/cm². FIG. 13A and FIG. 13B are micrographs when the internal stress is tensile and is of the order of $3 \times 10^9$ dyne/cm².

When the internal stress is substantially zero, as shown in FIGS. 11A and 11B, it is recognized that the surface of the Ta layer has irregularities, i.e., ridges and valleys with a period of the order of 0.5 μm. The cross section of the structure shows relatively large granular crystal grains.

As is clear from FIGS. 12A and 12B and FIGS. 13A and 13B, when the Ta layer has a compressive or tensile stress, the surfaces exhibit crystal grains of the order of 0.1 μm and the cross sections exhibit columnar grains which are peculiar to a high melting point metal. From these micrographs, it is seen that the columnar grains are also reflected to the surfaces shown in FIGS. 12B and 13B.

Figure 14A:
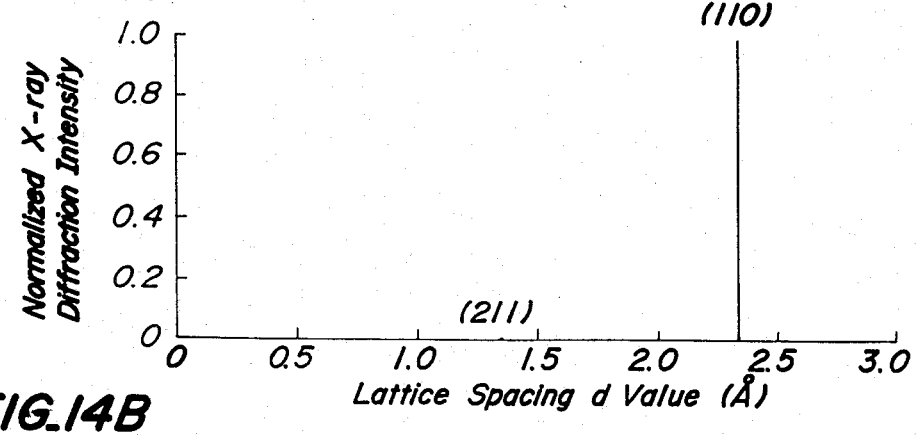
FIGS. 14A, 14B and 14C are graphs illustrating the relationship between d values showing a spacing of lattice planes and the normalized X-ray diffraction intensity.
Figure 14B:
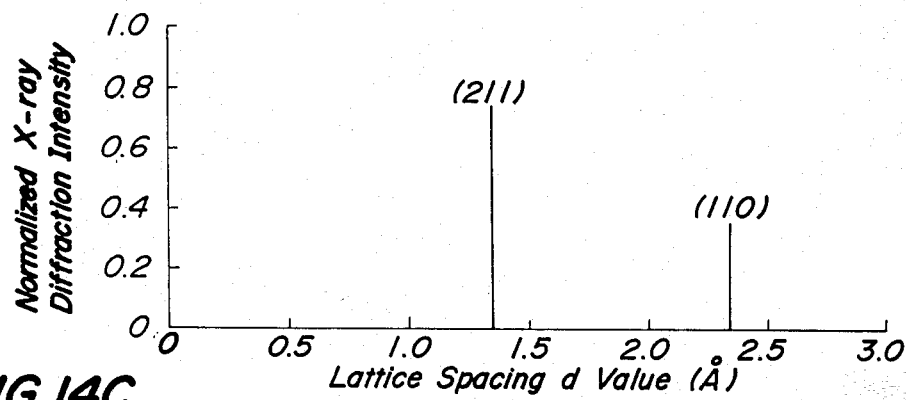
Figure 14C:
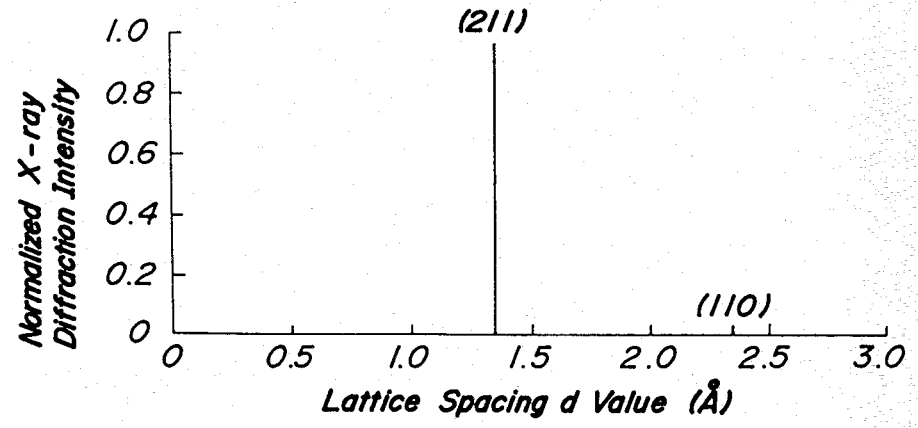

FIGS. 14A, 14B and 14C illustrate normalized X-ray diffraction intensities when the xenon pressure is varied, while applying a constant RF power of 700 W to the target 104. A spacing d(Å) of the lattice plane is plotted along the abscissa while the normalized X-ray diffraction intensity is plotted along the ordinate. When the pressures of the xenon gas were $1.35 \times 10^{-2}$ Torr, $3.05 \times 10^{-2}$ Torr and $4.40 \times 10^{-2}$ Torr, the internal stresses in the tanalum layers were $8.4 \times 10^9$ dyne/cm² (compressive), $0.31 \times 10^9$ dyne/cm² (compressive) and $6.1 \times 10^9$ dyne/cm² (tensile), respectively.

As is clear from FIG. 14A, when a high compressive stress ($8.4 \times 10^9$ dyne/cm²) exists in the Ta layer there exists a (110) plane of Ta in parallel with the surface of the mask substrate. On the other hand, when a high tensile stress exists in the Ta layer, there exists a (211) plane of Ta in parallel with the surface of the mask substrate. When the internal stress is high, regardless of compressive or tensile stress, columnar grains with a high degree of orientation grow in the Ta layer.

On the other hand, when the internal stress is low (for instance, $0.31 \times 10^9$ dyne/cm²), both the planes (211) and (110) of Ta coexist and are in parallel with the surface of the mask substrate, as shown in FIG. 14B. That is, the fact that granular crystal grains are grown while the growth of columnar grains is suppressed means the formation of a Ta layer in which (211) and (110) planes coexist.

The inventors have observed the fact that it is very important to suppress the growth of columnar grains in order to reduce or relieve the internal stress in the deposition of the Ta layer. It is especially advantageous to suppress the growth of columnar grains at the initial stage of the growth of the Ta layer on the mask substrate in order to reduce or relieve the internal stress in the Ta layer. On the other hand, no adverse effect is observed when columnar grains are grown to some extent on the granular crystal grains. As described above, in the present invention, the Ta absorber layer in the form of a single layer is formed, while controlling the granular crystal grains, so that the Ta absorber layer has a low internal stress.

Figure 15:
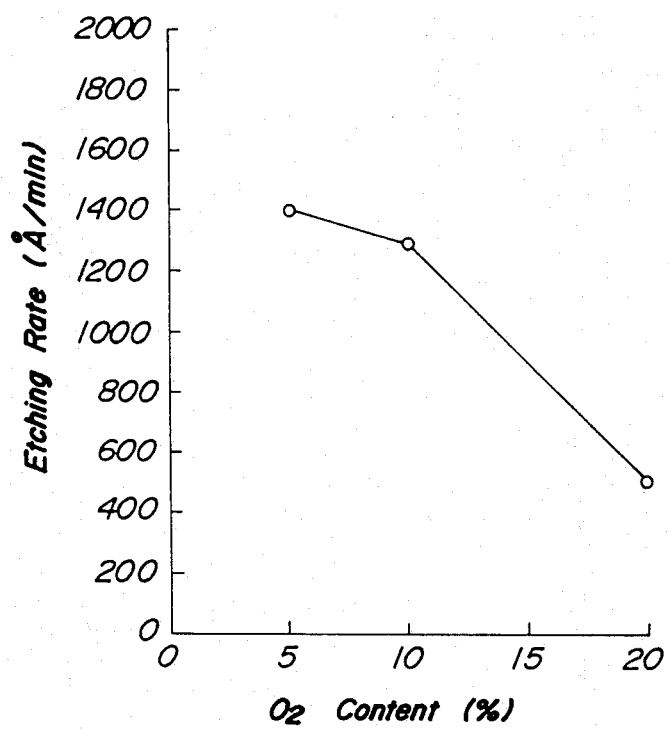
FIG. 15 is a graph illustrating the relationship between the oxygen content in % of a Ta layer formed by using $CBrF_3$ gas as an etchant and the etch rate.

FIG. 15 illustrates the relationship between the content of oxygen $O_2$(%) in the Ta layer and the etching rate (Å/min) when the Ta layer is etched by the reactive sputter etching method using $CBrF_3$ gas as an etchant. Here, the RF power is set at 100 W, while the pressure of $CBrF_3$ is set at 0.03 Torr. Ta is likely to become oxides, nitrides or carbides. However, if the oxygen content is less than 10 at. %, as shown in FIG. 15, the etching characteristics of the Ta layer are not adversely affected. The same is also true when the Ta layer contains other impurities such as nitrogen, carbon or the like. It follows, therefore, that in order to obtain a high etching rate, it is preferable to limit the concentration of impurities such as $O_2$ to less than about 10 at. %.

As described above, according to the present invention, the deposition conditions of a Ta layer are so controlled that granular crystal grains are grown and as a consequence the internal stress in the Ta layer is reduced or relieved. Furthermore, if required, the contents of impurities such as oxygen, nitrogen, carbon or the like may be controlled. Then, the Ta layer thus obtained can be used as an X-ray absorber layer.

Alternatively, a W layer formed also by the reactive sputter etching process using $CBrF_3$ gas as an etchant may advantageously be used as an X-ray absorber, instead of the Ta layer.

As seen from FIGS. 1A, 1B and 1C, in order to attain a mask contrast higher than 10dB, it is sufficient that the thickness of the X-ray absorber layer is substantially greater than 0.8 μm.

As described above, according to the present invention, the reactive sputter etching process is employed in the major steps in the fabrication of masks after the formation of a layer. Accordingly, as compared with the prior art process for ion etching of Au, the etching selectivity can be made higher, deviations of the pattern size due to mask retardation can be reduced to a minimum, and the etched material is exhausted as a volatile gas, so that re-deposition of the etched material is avoided. In this manner, a fine pattern can easily be formed.

As a result, a submicron tantalum X-ray absorber pattern having a high aspect ratio, a pattern width of 0.4 μm and a pattern thickness of 0.8 μm was formed with a high degree of dimensional accuracy,, and with a steep profile, i.e., vertical side walls in the pattern.

Figure 16A:
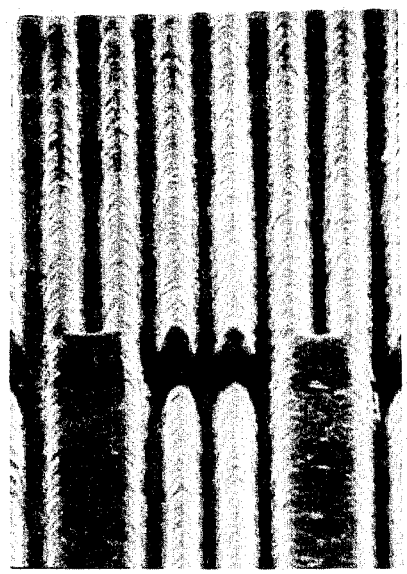
FIGS. 16A and 16B are scanning electron micrographs showing, for the sake of comparison, an X-ray lithography mask according to the present invention and an X-ray lithography mask of the prior art, respectively.
Figure 16B:
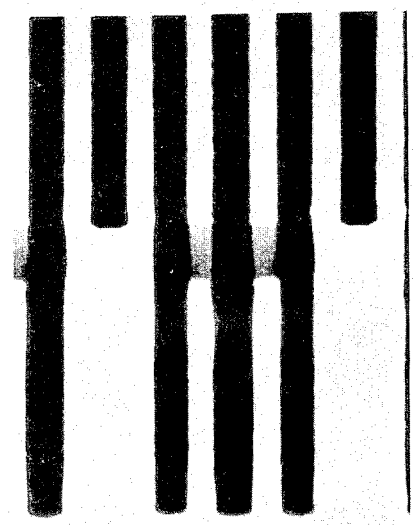

For the sake of comparison, FIG. 16A shows a scanning electron micrograph of a prior art Au X-ray absorber pattern obtained first by forming a resist pattern by using a mask for deep ultraviolet radiation exposure and then by ion etching, while FIG. 16B shows a scanning electron micrograph of the Ta X-ray absorber pattern in the present invention. Both the Au and Ta absorber layers are 0.8 μm in thickness. The patterns are a line-and-space pattern with a pitch of 1 μm. In the case of the prior art Au absorber pattern, the angle of inclination of the side walls is about 75° so that the patterns are not resolved. That is, the prior art process of ion etching of gold is not advantageously adapted to form a fine pattern with a pitch less than 0.5 μm, as shown in FIG. 16A. On the other hand, the Ta X-ray absorber pattern, as shown in FIG. 16B, has steep vertical side walls. Consequently, the present invention can provide a Ta absorber exhibiting a submicron pattern with a higher degree of dimensional accuracy.

Figure 2A:
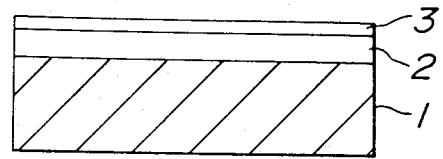
FIGS. 2A-2H are schematic cross sectional views used to explain the sequential steps of fabricating an X-ray mask with a gold absorber layer by the prior art ion etching process.
Figure 2B:
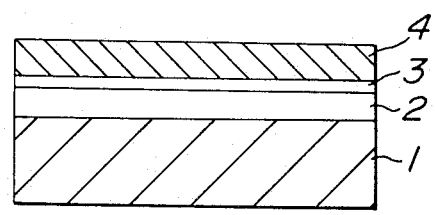
Figure 2C:
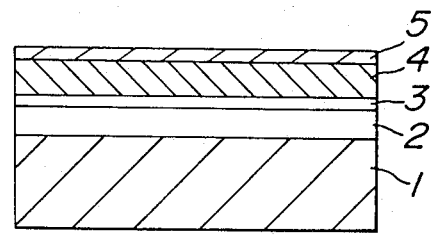
Figure 2D:
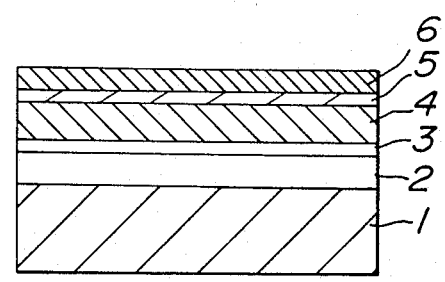
Figure 2E:
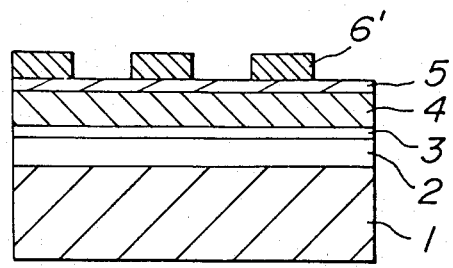
Figure 2F:
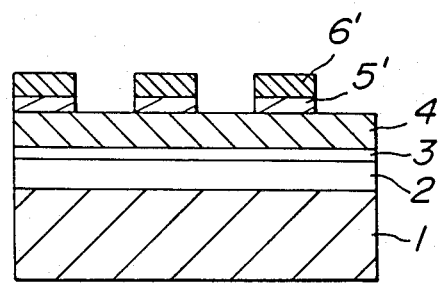
Figure 2G:
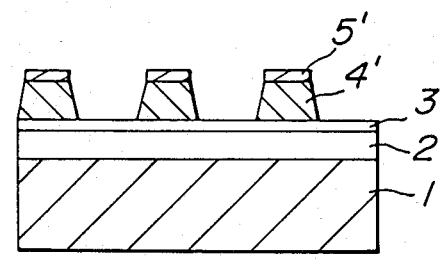
Figure 2H:
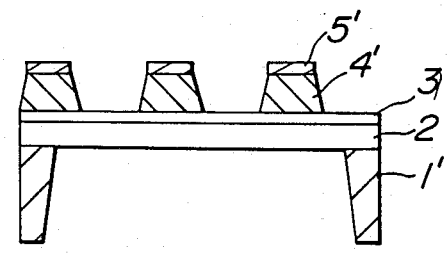

In the prior art ion etching process, an Au X-ray absorber layer requires the provision of the undercoating layer 3 thereon, as already shown in FIG. 2A, in order to obtain the desired degree of adhesion. In the prior art process of fabricating an X-ray lithography mask, it is usual that alignment marks are formed on the undercoating layer 3. However, the undercoating layer is extremely thin, so that the qualities of the undercoating layer vary over a wide range. In addition, because of the reaction between Ti as the undercoating layer and Au as the absorber layer, the reflectivity is likely to vary. As a result, the qualities of the alignment marks are degraded, so that misalignments frequently occur in the case of automatic alignment.

On the other hand, according to the present invention, such undercoating layer for the aid of good adhesion is not required. That is, it is sufficient that only a single Ta layer is formed, so that the qualities of the alignment marks to be formed on the Ta layer are stabilized. As a result, the automatic alignment can be effectively performed. In addition, the steps for forming an X-ray mask in the present invention are all dry process, so that the present invention may equally be applied to a mask substrate using a polymeric material such as polyimide which has poor resistance to chemicals.

As shown in FIGS. 6A–6H and FIGS. 7A–7J, in the case of an absorber having a double layer structure consisting of a silicon nitride or silicon oxide layer and a Ta absorber layer or consisting of a polymer layer and a Ta absorber layer, the silicon nitride layer, the silicon oxide layer or the polymer layer absorbs Auger electrons and photo electrons emitted from the Ta layer, so that a degree of mask contrast can be reflected effectively.

According to the present invention, the following advantageous effects are obtained.

(I) A Ta layer with a low internal stress is formed, so that the Ta layer is strongly adhered to a mask substrate without separation of the Ta layer from the mask substrate. In addition, deflections and distortions of the mask substrate are negligible.

(II) Since Ta is used as an X-ray absorber, a reactive sputter etching process can be employed in order to form a fine pattern. The reactive sputter etching process does not have such adverse effects as under-cutting and re-deposition, so that a fine pattern with a higher degree of dimensional accuracy and steep vertical side walls can be formed.

(III) While a conventional Au X-ray absorber has a pattern size greater than one 1 μm, Ta absorbers fabricated in accordance with the present invention have a pattern size less than 1 μm and even less than 0.2 μm.

(IV) While a prior art Au absorber needs an under-coating layer as described above in order to secure adhesion, such undercoating layer can be eliminated according to the present invention, so that the quality of the alignment marks is improved.

(V) All the steps are dry process, so that even a polymer mask substrate made of a polymer material such as polyimide which has poor chemical resistance can be used.

(VI) As compared with an Au X-ray absorber, a Ta X-ray absorber is inexpensive and therefore economically advantageous.

What is claimed is:

1. An X-ray lithography mask comprising:
a mask substrate; and
an X-ray absorber layer in the form of a single layer consisting entirely of granular crystal grains of a high melting point metal, said X-ray absorber layer being deposited directly on said mask substrate, said granular crystal grains being arranged in the direction of the thickness of said layer and causing said layer to have a substantially zero internal stress, and said X-ray absorber layer having a desired pattern.

2. An X-ray lithography mask as claimed in claim 1, wherein (211) and (110) planes of said high melting point metal coexist in said single layer and are in parallel with the surface of said mask substrate.

3. An X-ray lithography mask as claimed in claim 2, wherein an electron absorber layer is disposed on said X-ray absorber layer.

4. An X-ray lithography mask as claimed in claim 2, wherein said high melting point metal is tantalum or tungsten.

5. An X-ray lithography mask as claimed in claim 3, wherein said electron absorber layer consists of silicon oxide, silicon nitride or a polymer.

6. An X-ray lithography mask as claimed in claim 2, wherein said mask substrate consists of a substance selected from the group consisting of SiN, $Si_3N_4$, SiC, BN, polyimide, Mylar and a combination thereof.

7. A method for fabricating an X-ray lithography mask, comprising
a first step which includes placing a specimen having an X-ray mask substrate on a specimen table in a sputtering apparatus having means for supplying a rare gas and means for controlling the pressure of the rare gas so that the specimen is electrically insulated from ground potential so that said specimen is electrically floating with respect to ground potential;
a second step which includes forming a layer of a metal having a high melting point directly on said X-ray mask substrate in said apparatus while subjecting said specimen to an RF power field and exposing said specimen to the rare gas and maintaining the flow rate and pressure of the rare gas at values selected to cause the layer of high melting point metal to contain granular crystal grains in the direction of the thickness of that layer, the granular crystal grains causing the layer to have a substantially zero internal stress, said step of forming including controlling the RF power field and the pressure of the rare gas for maintaining the surface of said specimen at a floating potential in the range of −10 to −20 V; and a third step of forming an X-ray absorber layer with a predetermined pattern from said high melting point metal by reactive sputter etching.

8. A method for fabricating an X-ray lithography mask as claimed in claim 7, wherein said high melting point metal is tantalum or tungsten.

9. A method for fabricating an X-ray lithography mask as claimed in claim 8, wherein said third step includes:

a first sub-step of forming a resist pattern on said high melting point layer of tantalum or tungsten; and a second sub-step of forming said X-ray absorber layer with said desired pattern by the reactive sputter etching using $CBrF_3$ gas as an etchant, with said resist pattern being used as a mask.

10. A method for fabricating an X-ray lithography mask as claimed in claim 8, wherein said third step includes:

a first sub-step of forming a silicon oxide or silicon nitride layer on the surface of said high melting point layer of tantalum or tungsten;

a second sub-step of forming a resist pattern on the surface of said silicon oxide or silicon nitride layer;

a third sub-step of forming a silicon oxide or silicon nitride pattern layer from said silicon oxide or silicon nitride layer by reactive sputter etching, with said resist pattern being used as a mask; and a fourth sub-step of forming said X-ray absorber layer with said desired pattern by the reactive sputter etching using $CBrF_3$ gas as an etchant, with said silicon oxide or silicon nitride pattern layer being used as a mask.

11. A method for fabricating an X-ray lithography mask as claimed in claim 8, wherein said third step includes:

a first sub-step of applying a layer of a polymer having a high degree of resistance against dry etching on the surface of said high melting point layer of tantalum or tungsten;

a second sub-step of forming a resist pattern on the surface of said layer of the polymer;

a third sub-step of depositing a titanium or chrominum layer on said resist pattern;

a fourth sub-step of forming a titanium or chrominum pattern by lift-off process;

a fifth sub-step of forming a polymer pattern by reactive sputter etching in the atmosphere of oxygen, with said titanium or chrominum pattern being used as a mask; and a sixth sub-step of forming said X-ray absorber layer with said desired pattern by the reactive sputter etching using $CBrF3$ gas as an etchant, with said polymer pattern being used as a mask.

12. A method for fabricating an X-ray lithography mask as claimed in claim 7, wherein said rare gas is selected from the group consisting of xenon, argon and krypton.

13. A method for fabricating an X-ray lithography mask, comprising a first step which includes placing a specimen having an X-ray mask substrate on a specimen table in a sputtering apparatus having means for supplying a rare gas and means for controlling the pressure of the rare gas so that the specimen is electrically insulated from ground potential, and applying a DC bias voltage within a range of −10 to −20 V to said specimen;

a second step which includes forming a layer of a metal having a high melting point directly on said X-ray mask substrate in said apparatus by RF sputtering while exposing said specimen to the rare gas and maintaining the flow rate and pressure of the rare gas at values selected to cause the layer of high melting point metal to contain granular crystal grains in the direction of the thickness of that layer, the granular crystal grains causing the layer to have a substantially zero internal stress; and a third step of forming an X-ray absorber layer with a predetermined pattern from said high melting point metal by reactive sputter etching.

* * * * *